United States Patent
Katoh

(10) Patent No.: US 6,797,250 B2
(45) Date of Patent: Sep. 28, 2004

(54) SINGLE-CRYSTAL OPTICAL ELEMENT HAVING FLAT LIGHT-TRANSMITTING END SURFACE INCLINED RELATIVE TO CLEAVAGE PLANE

(75) Inventor: Takayuki Katoh, Kaisei-machi (JP)

(73) Assignee: Fuji Photo Film Co., Ltd., Kanagawa-Ken (JP)

( * ) Notice: Subject to any disclaimer, the term of this patent is extended or adjusted under 35 U.S.C. 154(b) by 0 days.

(21) Appl. No.: 10/379,941

(22) Filed: Mar. 6, 2003

(65) Prior Publication Data

US 2003/0159642 A1 Aug. 28, 2003

Related U.S. Application Data

(62) Division of application No. 09/540,904, filed on Mar. 31, 2000, now Pat. No. 6,558,465.

(30) Foreign Application Priority Data

Mar. 31, 1999 (JP) .......................................... 11-093047

(51) Int. Cl.[7] .......................... C01B 33/02; C30B 29/06
(52) U.S. Cl. ............................. 423/349; 423/350; 117/1
(58) Field of Search ................................ 423/349, 350; 117/1

(56) References Cited

U.S. PATENT DOCUMENTS

4,469,500 A 9/1984 Miller
5,667,583 A 9/1997 Kurata et al.

FOREIGN PATENT DOCUMENTS

DE 195 32 440 2/1997

OTHER PUBLICATIONS

Patent Abstracts of Japan, vol. 016, No. 412 (E1256), Aug. 31, 1992, & JP 04 137775 A (NEC Corp), May 12, 1992 (abstract).

Primary Examiner—Felisa Hiteshew
(74) Attorney, Agent, or Firm—Sughrue Mion, PLLC

(57) ABSTRACT

In an optical element which includes a single crystal having at least one flat light-transmitting end surface, the at least one light-transmitting end surface is inclined at at least 0.5 degrees relative to a plane perpendicular to one of an a-axis and a c-axis of the single crystal. In a process of producing such an optical element, a single crystal is cut out so that the single crystal has at least one surface which is inclined at at least 0.5 degrees relative to a plane perpendicular to one of an a-axis and a c-axis of the single crystal, and then the at least one surface is polished into at least one light-transmitting end surface.

20 Claims, 4 Drawing Sheets

F I G . 1
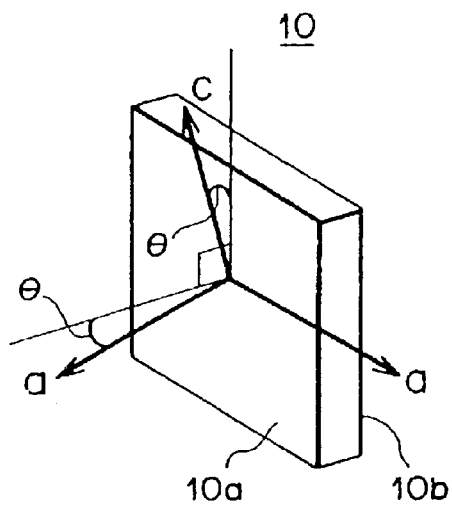
F I G . 2
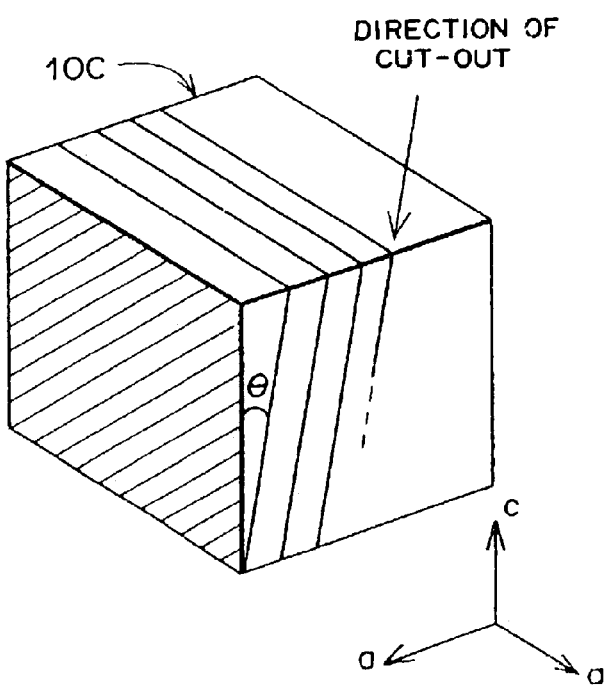

SINGLE-CRYSTAL OPTICAL ELEMENT HAVING FLAT LIGHT-TRANSMITTING END SURFACE INCLINED RELATIVE TO CLEAVAGE PLANE

This is a divisional of application Ser. No. 09/540,904 filed Mar. 31, 2000, now U.S. Pat. No. 6,558,465 the disclosure of which is incorporated herein by reference.

BACKGROUND OF THE INVENTION

1. Field of the Invention

The present invention relates to an optical element comprising a single crystal which has a light-transmitting end surface, and a process for manufacturing such an optical element. The present invention also relates to a solid-state laser device comprising an optical element as a solid-state laser medium.

2. Description of the Related Art

Conventionally, solid-state laser devices using a single crystal as a solid-state laser medium are known. In such solid-state laser devices, the single crystal is made of $R':RVO_4$ or $RVO_4$, where R' represents one or a combination of Nd, Er, Tm, Eu, Pr, Ho, Ce, Yb, Dy, Tb or Cr, and R represents Y or Gd. The solid-state laser mediums used in the conventional solid-state laser devices are produced by cutting out a single crystal having a flat light-transmitting end surface, and polishing the cut-out light-transmitting end surface into a mirror finished surface.

Conventionally, the above single crystal is cut out with a plane perpendicular to an a-axis or a c-axis (in other words, parallel with an a-axis or a c-axis) for use as a solid-state laser medium. For example, in the solid-state laser devices of the so-called c-axis end surface excitation type, a single crystal is cut out with a plane perpendicular to an a-axis, and the cut-out surface is polished so that the single crystal is used as a solid-state laser medium, where the solid-state laser devices are configured so that the direction of the linear polarization of the excitation light coincides with the direction of the c-axis of the solid-state laser medium.

However, the light-transmitting end surfaces of the conventional optical elements are prone to damage. Therefore, the yield rates of the conventional solid-state laser devices using the conventional optical elements as a solid-state laser medium are low, and the costs are high.

SUMMARY OF THE INVENTION

An object of the present invention is to provide an optical element which includes a single crystal having a light-transmitting end surface, which can be manufactured at a high yield rate and a low cost.

Another object of the present invention is to provide a method for manufacturing an optical element which includes a single crystal having a light-transmitting end surface, whereby the optical element can be manufactured at a high yield rate and a low cost.

A further object of the present invention is to provide a solid-state laser device which comprises an optical element including a single crystal with a light-transmitting end surface, and can be manufactured at a high yield rate and a low cost.

According to the first aspect of the present invention, there is provided an optical element which comprises a single crystal having a flat light-transmitting end surface. In the optical element, the light-transmitting end surface is inclined at at least 0.5 degrees relative to a plane perpendicular to one of an a-axis and a c-axis of the single crystal.

According to the second aspect of the present invention, there is provided a solid-state laser device having an optical element as a solid-state laser medium, wherein the optical element comprises a single crystal having a flat light-transmitting end surface, and the light-transmitting end surface is inclined at at least 0.5 degrees relative to a plane perpendicular to one of an a-axis and a c-axis of the single crystal.

According to the third aspect of the present invention, there is provided a process for producing an optical element which includes a single crystal having a light-transmitting end surface, comprising the steps of: (a) cutting out the single crystal so that the single crystal has a surface which is inclined at at least 0.5 degrees relative to a plane perpendicular to one of an a-axis and a c-axis of the single crystal; and (b) polishing the surface into the light-transmitting end surface.

The present inventor found the cause of the aforementioned problem that the light-transmitting end surface of the conventional optical element is prone to damage. That is, edges of the single crystals of the conventional optical elements are prone to break when the single crystals are cut out with the planes perpendicular to the a-axes and the c-axes, since single crystals are prone to cleave through such planes. Therefore, the edges of the single crystals of the conventional optical elements are prone to break during an operation of polishing cut-out surfaces of the single crystals, and it is probable that the light-transmitting end surfaces are rubbed with fragments of the single crystals. Thus, the light-transmitting end surface of the conventional optical element is prone to damage.

According to the present invention, the light-transmitting end surface is inclined at at least 0.5 degrees relative to the plane perpendicular to one of the a-axis and the c-axis of the single crystal. That is, the light-transmitting end surface is different from the cleavage planes. Therefore, the light-transmitting end surface of the optical element according to the present invention is not prone to break, and it is less probable that the light-transmitting end surfaces are rubbed with fragments of the single crystals during the polishing operation. Thus, according to the present invention, it is possible to prevent the damage of the light-transmitting end surface by the fragments of the crystals produced during the polishing operation, and achieve a high yield rate in production of the optical element.

Since the above high yield rate enables reduction in the price of the optical element, the solid-state laser device using such an optical element as a solid-state laser medium can be manufactured at a low cost.

The effect of increasing the yield rate becomes manifest when the light-transmitting end surface is inclined at at least 0.5 degrees relative to the plane perpendicular to one of the a-axis and the c-axis of the single crystal. The yield rate increases with increase in the inclination angle above 0.5 degrees, and the rate of increase in the yield rate becomes moderate when the inclination angle exceeds 5 degrees. When the inclination angle exceeds 20 degrees, the yield rate reaches its ceiling.

However, when the above optical element is used as a solid-state laser medium in some solid-state laser devices, it is not preferable to increase the inclination angle of the light-transmitting end surface in respect of luminous efficiency and the like. Since the yield rate reaches its ceiling when the inclination angle exceeds 20 degrees, it is preferable that the inclination angle of the light-transmitting end surface relative to the plane perpendicular to the one of the a-axis and the c-axis of the single crystal is at most 20 degrees. It is further preferable that the inclination angle of the light-transmitting end surface relative to the plane perpendicular to the one of the a-axis and the c-axis of the single crystal is at most 5 degrees.

In addition, in each aspect of the present invention, one or any combination of the following additional features may be provided.

(1) The single crystal may have a tetragonal lattice structure.

(2) The single crystal may be made of R':RVO$_4$ or RVO$_4$, where R' represents one or a combination of Nd, Er, Tm, Eu, Pr, Ho, Ce, Yb, Dy, Tb or Cr, and R represents Y or Gd.

(3) The light-transmitting end surface is inclined so that the light-transmitting end surface and a plane perpendicular to an a-axis may make an angle of at least 0.5 degrees around the c-axis.

(4) The light-transmitting end surface is inclined so that the light-transmitting end surface and a plane perpendicular to an a-axis may make an angle of at least 0.5 degrees around another a-axis of the single crystal.

Further, in the solid-state laser device according to the second aspect of the present invention, the following additional features may be provided.

(5) When the above additional feature (3) is provided, the solid-state laser device may be configured so that the direction of linear polarization of excitation light which excites the solid-state laser medium is parallel with the c-axis of the single crystal.

(6) When the above additional feature (4) is provided, the solid-state laser device may be configured so that the direction of linear polarization of the excitation light which excites the solid-state laser medium is perpendicular to the said another a-axis, which is contained in the light-transmitting end surface.

When the light-transmitting end surface and a plane perpendicular to the a-axis make an angle of at least 0.5 degrees around the c-axis, and the direction of linear polarization of the excitation light which excites the solid-state laser medium is parallel with the c-axis of the single crystal, the advantages of the great cross-section of stimulated emission and the great absorption coefficient are obtained, as in the case of the usual solid-state lasers of the c-axis end surface excitation type, and are not affected by the increase in the inclination angle of the light-transmitting end surface relative to the plane perpendicular to the a-axis of the single crystal. That is, the luminous efficiency and the like are not reduced by the increase in the inclination angle of the light-transmitting end surface relative to the plane perpendicular to the a-axis of the single crystal, as long as the direction of linear polarization of the excitation light which excites the solid-state laser medium is parallel with the c-axis of the single crystal.

When the light-transmitting end surface and a plane perpendicular to the a-axis make an angle of at least 0.5 degrees around the other a-axis of the single crystal, and the direction of linear polarization of the excitation light which excites the solid-state laser medium is perpendicular to the other a-axis, which is contained in the light-transmitting end surface, the direction of linear polarization of the excitation light includes a c-axis component (component in the direction of the c-axis) and an a-axis component (component in the direction of an a-axis). In order to exploit, as much as possible, the advantages of the great cross-section of stimulated emission and the great absorption coefficient, it is necessary to increase the c-axis component of the direction of linear polarization of the excitation light. That is, when the light-transmitting end surface and a plane perpendicular to the a-axis make an angle of at least 0.5 degrees around another a-axis of the single crystal, and the direction of linear polarization of the excitation light which excites the solid-state laser medium is perpendicular to the other a-axis, which is contained in the light-transmitting end surface, it is preferable that the inclination angle of the light-transmitting end surface relative to the plane perpendicular to the a-axis of the single crystal is as small as possible.

DESCRIPTION OF THE DRAWINGS

FIG. 1 is a diagram illustrating the construction of the laser crystal 10 as the first embodiment of the optical element according to the first aspect of the present invention.

FIG. 2 is a diagram illustrating the way of cutting out the laser crystal 10 of FIG. 1 from a single crystal 10C.

DESCRIPTION OF PREFERRED EMBODIMENTS

Embodiments of the present invention are explained in detail below with reference to drawings.

First Embodiment

FIG. 1 is a diagram illustrating the construction of the laser crystal 10 as the first embodiment of the optical element according to the first aspect of the present invention, and FIG. 2 is a diagram illustrating the way of cutting out the laser crystal 10 of FIG. 1 from a single crystal 10C.

The laser crystal 10 is, for example, a crystal of Nd:YVO$_4$, e.g., YVO$_4$ doped with 3 atomic percent Nd. As illustrated in FIG. 2, a single crystal 10C is cut along planes which are inclined at an angle θ around an a-axis (the first a-axis) relative to a plane (indicated by hatching) perpendicular to another a-axis (the second a-axis), and the cut-out surfaces are polished to produce light-transmitting end surfaces 10a and 10b, as illustrated in FIG. 1. As mentioned before, in the conventional uniaxial crystals, the single crystal 10C is cut along planes perpendicular to an a-axis or a c-axis, such as the plane (indicated by hatching) perpendicular to the other a-axis (the second a-axis) illustrated in FIG. 2.

The present inventor has measured yield rates of the laser crystal 10 for various inclination angles θ. The measurement has been performed under a specified condition that the laser crystal 10 has a dimension of 2.5 mm×2.5 mm, the flatness of the light-transmitting end surfaces 10a and 10b is λ/10, the parallelism of the light-transmitting end surfaces 10a and 10b is 30″, and the surface roughness of the light-transmitting end surfaces 10a and 10b is 0.5 nm rms. Ten samples of the laser crystal 10 are prepared for each value of the inclination angle θ, and the light-transmitting end surfaces of the samples of the laser crystal 10 are examined for flaws. That is, twenty light-transmitting end surfaces in total are examined for each value of the inclination angle θ. In practice, an area within a circle having a diameter of 1 mm at the center of each light-transmitting end surface is examined under a dark-field microscope of 100× magnification. When no flaw is found in the above area, the light-transmitting end surface is determined to be acceptable.

When polishing the light-transmitting end surfaces of the laser crystal 10, the cut-out sample of the laser crystal 10 and a piece of glass (BK7) provided for blocking are stuck to a glass substrate of BK7 with wax, and the light-transmitting end surfaces of each sample are finished one by one. In the polishing operation, free abrasive particles (e.g., green carbon) are used for smoothing, and after shaping, pitch polishing is performed by using cerium oxide. The polishing operation is completed when the above specified condition of the flatness, parallelism, and surface roughness of the light-transmitting end surfaces 10a and 10b is satisfied.

Figure 3:
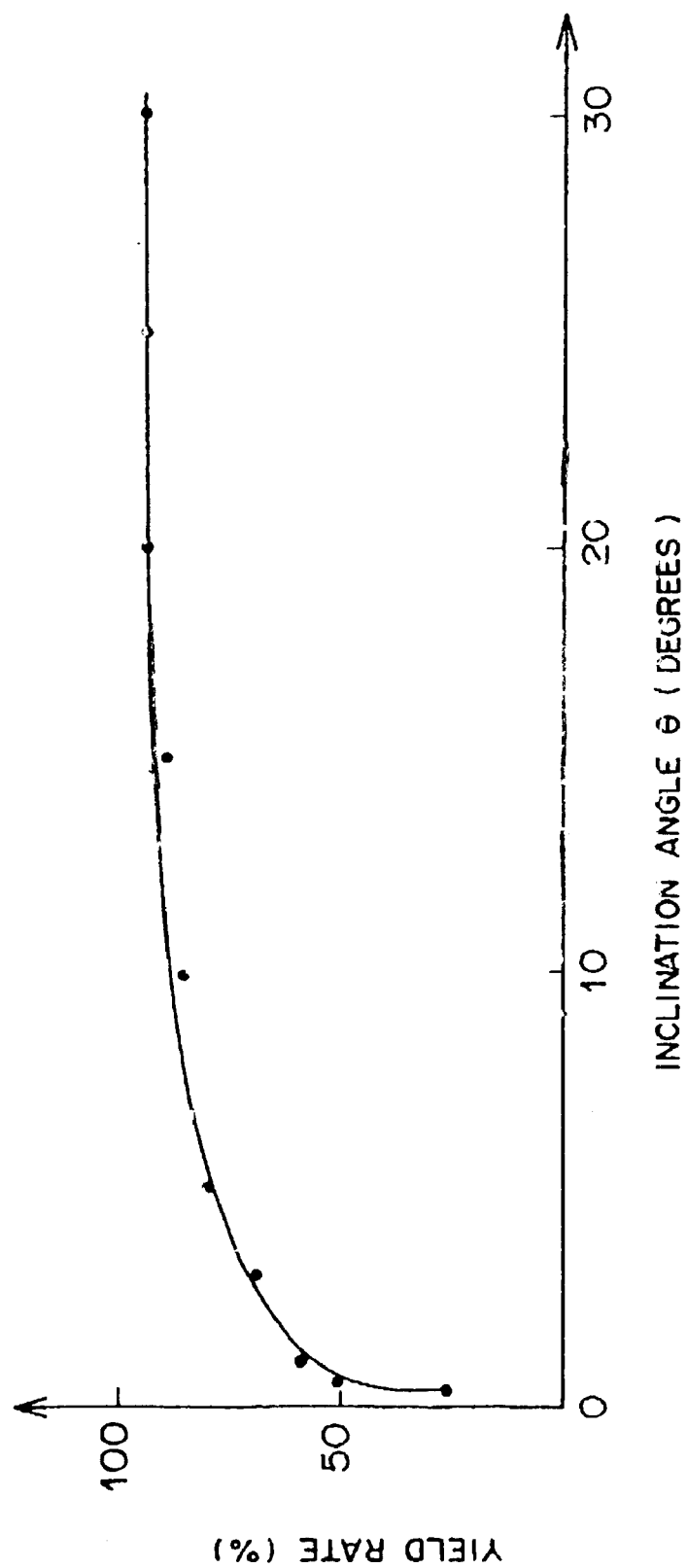
FIG. 3 is a graph indicating yield rates of laser crystals having various inclination angles θ.

Table 1 and FIG. 3 show a result of the above measurement. As indicated in Table 1 and FIG. 3, the yield rate is remarkably increased when the inclination angle reaches 0.5 degrees. The yield rate increases with increase in the inclination angle above 0.5 degrees, and the rate of increase in the yield rate becomes moderate when the inclination angle exceeds 5 degrees. When the inclination angle exceeds 20 degrees, the yield rate reaches its ceiling.

TABLE 1

| Inclination Angle θ (Degree) | Acceptable/ Total Number of Surfaces | Yield Rate (%) |
| --- | --- | --- |
| less than 0.4° | 5/20 | 25 |
| 0.5° | 10/20 | 50 |
| 1° | 12/20 | 60 |
| 3° | 14/20 | 70 |
| 5° | 16/20 | 80 |
| 10° | 17/20 | 85 |
| 15° | 18/20 | 90 |
| 20° | 19/20 | 95 |
| 25° | 19/20 | 95 |
| 30° | 19/20 | 95 |

Figure 4:
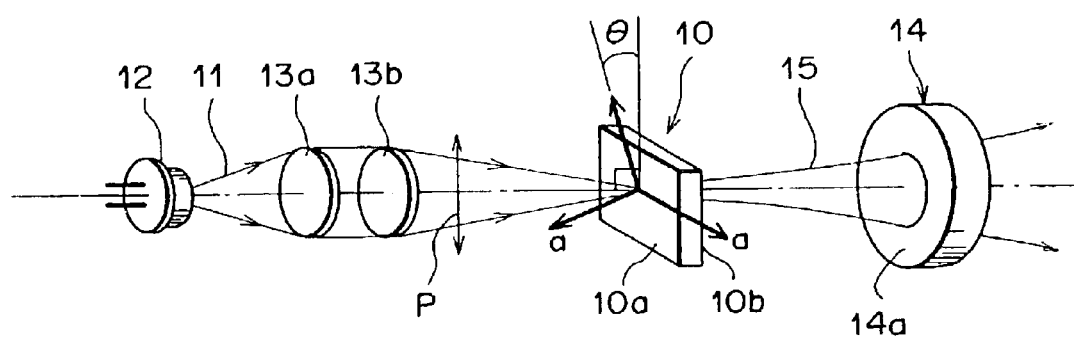
FIG. 4 is a diagram illustrating the construction of the solid-state laser device using the laser crystal 10 of FIG. 1.

Next, explanations on a solid-state laser device using the above laser crystal 10 are provided below with reference to FIG. 4. The solid-state laser device of FIG. 4 comprises the above laser crystal 10, a semiconductor laser device 12, a condenser lenses 13a and 13b, and a resonator mirror 14. The semiconductor laser device 12 emits a laser beam 11 for exciting the laser crystal 10. The condenser lenses 13a and 13b condense the laser beam 11, which is converging light. The resonator mirror 14 is provided on the forward (right) side of the laser crystal 10 for realizing a resonator.

In this example, the wavelength of the laser beam 11 emitted from the semiconductor laser device 12 is 810 nm. The laser beam 11 excites neodymium ions in the laser crystal 10, and the laser crystal 10 emits light having a wavelength of 1,064 nm.

A coating is provided on a mirror surface 14a of the resonator mirror 14 so that the mirror surface 14a has reflectance of 99% at the wavelength of 1,064 nm. Another coating is provided on the backward-side light-transmitting end surface 10a of the laser crystal 10 so that the backward-side light-transmitting end surface 10a has reflectance of less than 3% at the wavelength of 810 nm, and reflectance of more than 99.9% at the wavelength of 1,064 nm. Therefore, the laser beam 11 having the wavelength of 810 nm passes well through the backward-side light-transmitting end surface 10a, and the light having the wavelength of 1,064 nm is reflected well by the backward-side light-transmitting end surface 10a. A further coating is provided on the forward-side light-transmitting end surface 10b of the laser crystal 10 so that the forward-side light-transmitting end surface 10b has reflectance of less than 0.5% at the wavelength of 1,064 nm. Therefore, the light having the wavelength of 1,064 nm passes well through the forward-side light-transmitting end surface 10b.

Thus, the light having the wavelength of 1,064 nm resonates between the backward-side light-transmitting end surface 10a and the mirror surface 14a. That is, a Fabry-Perot resonator is formed by the laser crystal 10 and the resonator mirror 14, laser oscillation occurs at the wavelength of 1,064 nm, and a solid-state laser beam 15 exits from the resonator through the resonator mirror 14.

Since the laser crystal 10 is cut out as explained before with reference to FIG. 2, the light-transmitting end surfaces 10a and 10b are inclined at the angle θ around the aforementioned first a-axis relative to the plane perpendicular to the aforementioned second a-axis, where the angle θ is at least 0.5 degrees, as illustrated in FIG. 1. In this embodiment, the semiconductor laser device 12 and the laser crystal 10 are arranged so that the direction of linear polarization of the laser beam 11 is perpendicular to the first a-axis which is contained in the plane perpendicular to the aforementioned second a-axis. In FIG. 4, the direction of linear polarization of the laser beam 11 is indicated by the arrows P.

In the above configuration, the direction of linear polarization of the excitation light includes a c-axis component (component in the direction of the c-axis) and an a-axis component (component in the direction of the first a-axis). In order to exploit, as much as possible, the advantages of the great cross-section of stimulated emission and the great absorption coefficient which are obtained when the direction of linear polarization of the excitation light coincides with the c-axis, it is necessary to increase the c-axis component in the direction of linear polarization of the excitation light. That is, it is preferable to decrease the inclination angle θ of the light-transmitting end surface relative to the plane perpendicular to the a-axis of the single crystal.

In the above situation, it is preferable that the inclination angle θ is at most 20 degrees, and it is further preferable that the inclination angle θ is at most 5 degrees.

Second Embodiment

Figure 5:
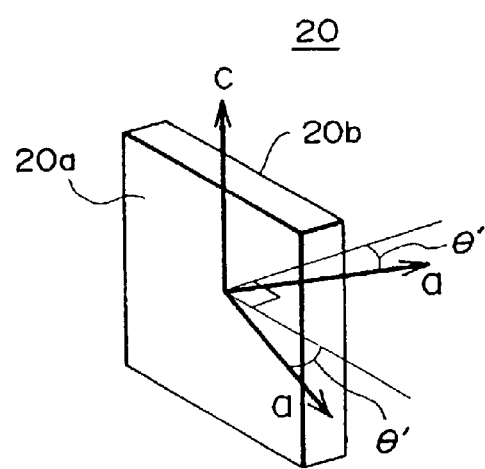
FIG. 5 is a diagram illustrating the construction of the laser crystal 20 as the second embodiment of the optical element according to the first aspect of the present invention.
Figure 6:
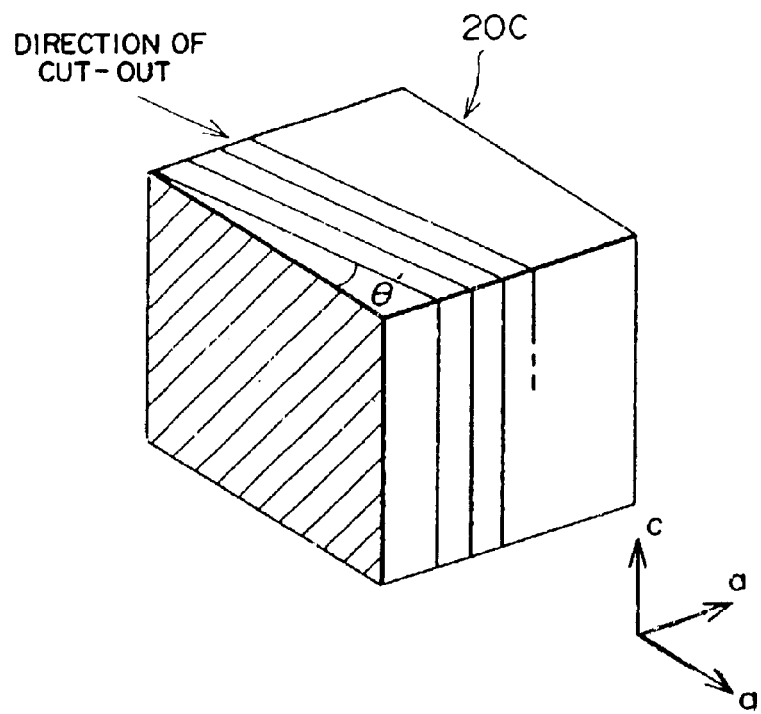
FIG. 6 is a diagram illustrating the way of cutting out the laser crystal 20 of FIG. 5 from a single crystal 20C.

FIG. 5 is a diagram illustrating the construction of the laser crystal 20 as the second embodiment of the optical element according to the first aspect of the present invention, and FIG. 6 is a diagram illustrating the way of cutting out the laser crystal 20 of FIG. 5 from a single crystal 20C.

The laser crystal 20 is, for example, a crystal of Nd:YVO$_4$, e.g., YVO$_4$ doped with 3 atomic percent Nd. As illustrated in FIG. 6, a single crystal 20C is cut along planes, which are inclined at an angle θ' around the c-axis relative to a plane (indicated by hatching) perpendicular to one of two a-axes, and the cut-out surfaces are polished to produce light-transmitting end surfaces 20a and 20b, as illustrated in FIG. 6.

The present inventor has also measured yield rates of the laser crystal 20 for various inclination angles θ'. The measurement result is similar to the result indicated in Table 1 and FIG. 3.

Figure 7:
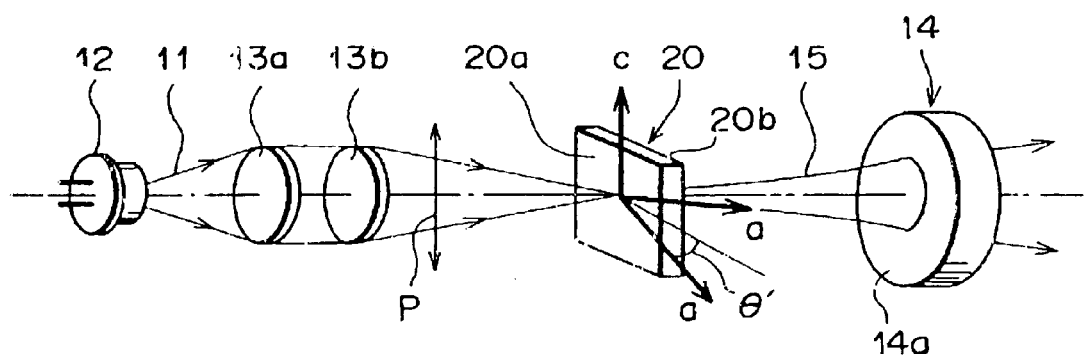
FIG. 7 is a diagram illustrating the construction of the solid-state laser device using the laser crystal 20 of FIG. 5.

Next, explanations on a solid-state laser device using the above laser crystal 20 are provided below with reference to FIG. 7. The solid-state laser device of FIG. 7 has the same construction as the construction of FIG. 4 except that the laser crystal 20, instead of the laser crystal 10, is provided, and the directions of the crystal axes of the laser crystal 20 relative to the direction P of linear polarization of the laser beam 11 in the construction of FIG. 7 are different from the relative directions of the crystal axes of the laser crystal 10 in the construction of FIG. 4.

Since the laser crystal 20 is cut out as explained before with reference to FIG. 6, the light-transmitting end surfaces 20a and 20b are inclined at the angle θ' around the c-axis relative to the plane perpendicular to the a-axis, where the angle θ' is at least 0.5 degrees, as illustrated in FIG. 5. In this embodiment, the semiconductor laser device 12 and the laser crystal 20 are arranged so that the direction of linear polarization of the laser beam 11 is parallel with the c-axis of the laser crystal 20. In FIG. 7, the direction of linear polarization of the laser beam 11 is also indicated by the arrows P.

Since the direction of linear polarization of the laser beam 11 is parallel with the c-axis of the laser crystal 20, the advantages of the great cross-section of stimulated emission and the great absorption coefficient are obtained, as in the case of the usual the solid-state lasers of the c-axis end surface excitation type, and are not affected by the increase in the inclination angle θ' of the light-transmitting end surfaces relative to the plane perpendicular to the a-axis of the laser crystal 20. That is, the luminous efficiency and the like are not damaged by the increase in the inclination angle θ', as long as the direction of linear polarization of the laser beam 11 is parallel with the c-axis of the laser crystal 20.

Further, it should be noted that the laser crystal 20 may be cut out along a plane inclined with respect to both the a-axis and the c-axis.

Furthermore, although the laser crystal is doped with Nd in the above-described embodiment, it should be noted that the crystal may be a single crystal doped with other kind of rare earth element or may not be doped with such element. The same result has been confirmed with such a crystal as well.

Other Matters

The scope of the present invention is not limited to laser crystals. The present invention can be applied to any type of an optical element being produced from a single crystal and having a light-transmitting end surface, and the same effects are obtained in such an optical element.

In addition, all of the contents of the Japanese patent application No. 11(1999)-93047 are incorporated into this specification by reference.

What is claimed is:

1. An optical element comprising a single crystal which has at least one a-axis, a c-axis, and a flat light-transmitting end surface, wherein
said light-transmitting end surface is inclined at at least 0.5 degrees relative to a plane perpendicular to one of said at least one a-axis and said c-axis of the single crystal.

2. An optical element according to claim 1, wherein said single crystal has a tetragonal lattice structure.

3. An optical element according to claim 1, wherein said single crystal is made of one of R':RVO$_4$, and RVO$_4$, R' representing one or a combination of Nd, Er, Tm, Eu, Pr, Ho, Ce, Yb, Dy, Tb or Cr, and R representing Y or Gd.

4. An optical element according to claim 1, wherein said light-transmitting end surface and a plane perpendicular to one of said at least one a-axis make an angle of at least 0.5 degrees around said c-axis.

5. An optical element according to claim 1, wherein said light-transmitting end surface and a plane perpendicular to said a-axis make an angle of at least 0.5 degrees around another of said at least one a-axis of said single crystal.

6. An optical element according to claim 1, wherein said light-transmitting end surface as inclined at at most 20 degrees relative to said plane perpendicular to said one of said at least one a-axis and said c-axis of the single crystal.

7. An optical element according to claim 1, wherein said light-transmitting end surface and a plane perpendicular to one of said at least one a-axis make an angle of at least 0.5 degrees around said c-axis, and said single crystal is Nd:YVO$_4$.

8. An optical element according to claim 1, wherein said light-transmitting end surface and a plane perpendicular to one of said at least one a-axis make an angle of at least 0.5 degrees around another of said at least one a-axis of said single crystal, and said single crystal is Nd:YVO$_4$.

9. An optical element according to claim 5, wherein said light-transmitting end surface is inclined at at most 20 degrees relative to said plane perpendicular to said one of said at least one a-axis and said c-axis of the single crystal, and said single crystal is Nd:YVO$_4$.

10. A solid-state laser device comprising an optical element as a solid-state laser medium, wherein
said optical element comprises a single crystal having at least one a-axis, a c-axis, and a flat light-transmitting end surface; and
said light-transmitting end surface is inclined at at least 0.5 degrees relative to a plane perpendicular to one of said at least one a-axis and said c-axis of the single crystal.

11. A solid-state laser device according to claim 10, wherein said single crystal has tetragonal lattice structure.

12. A solid-state laser device according to claim 10, wherein said single crystal is made of R':RVO$_4$ or RVO$_4$, R' representing one or a combination of Nd, Er, Tm, Eu, Pr, Ho, Ce, Yb, Dy, Tb or Cr, and R representing Y or Gd.

13. A solid-state laser device according to claim 10, wherein said light-transmitting end surface and a plane perpendicular to one of said at least one a-axis make an angle of at least 0.5 degrees around said c-axis.

14. A solid-state laser device according to claim 13, wherein a direction of linear polarization of excitation light which excites said solid-state laser medium is parallel with said c-axis of said single crystal.

15. A solid-state laser device according to claim 10, wherein said light-transmitting end surface and a plane perpendicular to one of said at least one a-axis make an angle of at least 0.5 degrees around another of said at least one a-axis of said single crystal.

16. A solid-state laser device according to claim 15, wherein a direction of linear polarization of excitation light which excites said solid-state laser medium is perpendicular to said another of said at least one a-axis, which is contained in said light-transmitting end surface.

17. A solid-state laser device according to claim 10, wherein said light-transmitting end surface is inclined at at most 20 degrees relative to said plane perpendicular to said one of said at least one a-axis and said c-axis of the single crystal.

18. A solid-state laser device according to claim 10, wherein said light-transmitting end surface and a plane perpendicular to one of said at least one a-axis make an angle of at least 0.5 degrees around said c-axis, and said single crystal is Nd:YVO$_4$.

19. A solid-state laser device according to claim 10, wherein said light-transmitting end surface and a plane perpendicular to one of said at least one a-axis make an angle of at least 0.5 degrees around another of said at least one a-axis of said single crystal, and said single crystal is Nd:YVO$_4$.

20. A solid-state laser device according to claim 10, wherein said light-transmitting end surface is inclined at at most 20 degrees relative to said plane perpendicular to said one of said at least one a-axis and said c-axis of the single crystal, and said single crystal is Nd:YVO$_4$.

* * * * *